United States Patent
Karp et al.

(10) Patent No.: US 8,881,085 B1
(45) Date of Patent: Nov. 4, 2014

(54) CELL-LEVEL ELECTROSTATIC DISCHARGE PROTECTION FOR AN INTEGRATED CIRCUIT

(75) Inventors: James Karp, Saratoga, CA (US); Greg W. Starr, San Jose, CA (US); Mohammed Fakhruddin, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 173 days.

(21) Appl. No.: 12/793,584

(22) Filed: Jun. 3, 2010

(51) Int. Cl.
*G06F 17/50* (2006.01)
*G06F 7/38* (2006.01)
*H01L 25/00* (2006.01)

(52) U.S. Cl.
USPC ........... 716/122; 716/110; 716/111; 716/112; 716/118; 716/119; 716/121; 716/126; 716/128; 716/129; 716/130; 326/37; 326/41

(58) Field of Classification Search
CPC .................. H03K 19/17728; H03K 19/17736; G06F 17/5068; G06F 17/5081; G06F 17/5072; G06F 17/5077
USPC .............. 326/37, 41; 716/110, 111, 112, 118, 716/119, 121, 122, 126, 128, 129, 130
See application file for complete search history.

(56) References Cited

U.S. PATENT DOCUMENTS

| | | | |
|---|---|---|---|
| 5,404,041 A * | 4/1995 | Diaz et al. ..................... 257/360 |
| 5,506,437 A | 4/1996 | May et al. | |
| 5,714,784 A * | 2/1998 | Ker et al. ..................... 257/360 |
| 6,005,797 A | 12/1999 | Porter et al. | |
| 6,446,250 B1 * | 9/2002 | Becker .......................... 716/122 |
| 6,550,047 B1 * | 4/2003 | Becker .......................... 716/122 |
| 6,956,266 B1 * | 10/2005 | Voldman et al. ............. 257/371 |
| 7,549,135 B2 * | 6/2009 | Chapman et al. ............ 716/135 |
| 7,626,243 B2 * | 12/2009 | Disney et al. ................ 257/546 |
| 8,004,904 B2 | 8/2011 | Momii | |
| 2002/0031882 A1 | 3/2002 | Uchida | |
| 2003/0174452 A1 | 9/2003 | Chen et al. | |
| 2004/0047094 A1 * | 3/2004 | Chen et al. ..................... 361/56 |
| 2005/0275032 A1 * | 12/2005 | Kodama et al. ............... 257/355 |
| 2006/0226499 A1 * | 10/2006 | Shimizu ....................... 257/409 |
| 2007/0004150 A1 * | 1/2007 | Huang et al. ................. 438/275 |
| 2007/0080406 A1 | 4/2007 | Snyder et al. | |
| 2008/0029820 A1 * | 2/2008 | Disney et al. ................ 257/355 |
| 2008/0134104 A1 * | 6/2008 | Chapman et al. ............... 716/2 |
| 2008/0142899 A1 | 6/2008 | Morris et al. | |
| 2009/0180225 A1 * | 7/2009 | Pan et al. ...................... 361/56 |
| 2010/0264953 A1 | 10/2010 | Lilja | |
| 2011/0049621 A1 | 3/2011 | Lotfi et al. | |

OTHER PUBLICATIONS

Allen, Phillip E., "Lecture 80—Latchup & ESD", Short Courses and Educational Resources by Phillip E. Allen, AICDesign.org, Mar. 24, 2010, pp. 080-1 to 080-32.*

(Continued)

*Primary Examiner* — Stacy Whitmore
(74) *Attorney, Agent, or Firm* — Kevin T. Cuenot

(57) ABSTRACT

A method of evaluating a layout cell for electrostatic discharge (ESD) protection can include identifying at least one feature of the layout cell for use in implementing an integrated circuit (IC) and comparing the at least one feature of the layout cell to an ESD requirement for the IC. The method can include indicating whether the feature of the layout cell complies with the ESD requirement.

19 Claims, 4 Drawing Sheets

(56) References Cited

OTHER PUBLICATIONS

Wang, Albert, Z.H., On-chip ESD Protection for Integrated Circuits, an IC Design Perspective, Kluwer Academic Publishers, Boston, Jan. 2002, ISBN 0-7923-7647-1, pp. 74.
U.S. Appl. No. 14/010,059, filed Aug. 26, 2013, Fakhruddin et al.
U.S. Appl. No. 13/439,721, filed Apr. 4, 2012, Karp et al.
U.S. Appl. No. 13/439,706, filed Apr. 4, 2012, Hart et al.
U.S. Appl. No. 13/587,823, filed Aug. 16, 2012, Hart et al.
Hsieh, C.M. et al., "A Field-Funneling Effect on the Collection of Alpha-Particle-Generated Carriers in Silicon Devices," *IEEE Electron Device Letters*, Apr. 1981, pp. 103-105, vol. EDL-2, No. 4, IEEE, Piscataway, New Jersey, USA.
Ziegler, James F. et al., *SER—History, Trends and Challenges: A Guide for Designing with Memory ICs*, Aug. 19, 2004, pp. 6-3-6-5, Cypress Semiconductor, San Jose, California, USA.
Dodds, N. A. et al., "Selection of well Contact Densities for Latchup-Immune Minimal-Area ICs", IEEE Transactions on Nuclear Science, IEEE Service Center, New York, NY, US, vol. 57 No. 6, Dec. 2010, pp. 3575-3581.
U.S. Appl. No. 13/686,553, filed Nov. 27, 2012, Jain, Praful et al.
Jan, C.H., et al., "A 32nm SoC Platform Technology with $2^{nd}$ Generation High-k/Metal Gate Transistors Optimized for Ultra Low Power, High Performance, and High Density Product Applications", pp. 28.1.1-28.1.4, 2009 IEEE International Electron Devices Meeting, IEDM09, Dec. 6-9, 2009, Baltimore, MD.
Klein, M., "Power Consumption at 40 and 45nm", White Paper, WP298 (v1.0), Apr. 13, 2009, pp. 1-21, p. 7, Xilinx, Inc., San Jose, CA.
Santarini, M., "How Xilinx Halved Power Draw in 7 Series FPGAs", Xilinx, Inc., Xcell Journal, Issue 76, $3^{rd}$ Quarter, 2011, pp. 10-11, San Jose, CA.
Shiyanovskii, Y. et al., "Effect of Voltage Scaling on soft Error Protection Methods for SRAMs", Proceedings of the IEEE 2010 National Aerospace and Electronics Conference (NAECON), Jul. 14-16, 2010, pp. 328-333 Dayton, Ohio.

\* cited by examiner

CELL-LEVEL ELECTROSTATIC DISCHARGE PROTECTION FOR AN INTEGRATED CIRCUIT

FIELD OF THE INVENTION

One or more embodiments disclosed within this specification relate to integrated circuits (ICs). More particularly, one or more embodiments relate to cell-level electrostatic discharge protection for an IC.

BACKGROUND

An electrostatic discharge (ESD) event refers to a temporary and abrupt flow of current between two objects of differing electrical potentials. ESD can be a serious issue for a solid-state electronic integrated circuit (IC) as large potential changes and current flows that occur during the ESD event can damage silicon junctions and oxide insulators. Damage to an IC from the ESD event can diminish the performance of the silicon-based IC, if not render the IC inoperable.

A charge buildup on an IC can occur for a variety of different reasons and can occur during manufacturing, assembly, testing, and/or use of the IC. As a result, the IC can be subjected to inadvertent ESD events prior, and subsequent, to assembly and sale. ESD device testing is used to ascertain the sensitivity of an IC to an ESD event. ESD testing can be performed using a variety of approaches, with each approach attempting to model a different type of ESD event.

One ESD testing approach is based upon a charged device model (CDM). The CDM attempts to duplicate an ESD event that begins with an IC accumulating charge. The charged IC subsequently makes contact with a conductive object and discharges the accumulated charge into the conductive object. For example, during manufacturing, ICs can be charged while sliding down the feeder of an automatic assembler and subsequently discharged upon contact with an insertion head of the assembler.

ESD protection schemes are implemented to protect devices internal to the IC that can be vulnerable to ESD events. Devices considered vulnerable typically are devices that output to, or come in contact with, external nodes of the IC. For this reason, ESD protection schemes typically attempt to steer current around output devices, effectively bypassing the ESD sensitive output devices of the IC. In some cases, however, active devices internal to an IC, i.e., non-output devices, that neighbor unused substrate regions also can fail when the IC is subjected to a CDM type of ESD event. The failure of an active device due to a CDM type of ESD event can render the IC inoperable, thereby reducing manufacturing yields and increasing manufacturing costs for the IC.

SUMMARY

One or more embodiments disclosed within this specification relate to integrated circuits (ICs) and, more particularly, to cell-level electrostatic discharge (ESD) protection for an IC. One embodiment of the present invention can include a method of evaluating a layout cell for ESD protection. The method can include identifying at least one feature of the layout cell for use in implementing an IC, comparing, via a processor, the at least one feature of the layout cell to an ESD requirement for the IC, and indicating whether the feature of the layout cell complies with the ESD requirement.

Another embodiment of the present invention can include a system including a memory storing program code and a processor coupled to the memory. The processor, upon executing the program code, can be configured to evaluate a layout cell for ESD protection and perform a plurality of steps including identifying at least one feature of a layout cell for use in implementing an IC, comparing the at least one feature of the layout cell to an ESD requirement for the IC, and indicating whether the feature of the layout cell complies with the ESD requirement.

Another embodiment of the present invention can include a device including a non-transitory data storage medium usable by a system comprising a processor and a memory. The data storage medium can store program code that, when executed by the system, causes the system to execute operations for evaluating a layout cell for ESD protection. The operations can include identifying at least one feature of a layout cell for use in implementing an IC, comparing the at least one feature of the layout cell to an ESD requirement for the IC, and indicating whether the feature of the layout cell complies with the ESD requirement.

DETAILED DESCRIPTION OF THE DRAWINGS

While the specification concludes with claims defining the features of one or more embodiments of the invention that are regarded as novel, it is believed that the one or more embodiments of the invention will be better understood from a consideration of the description in conjunction with the drawings. As required, one or more detailed embodiments of the present invention are disclosed herein; however, it is to be understood that the one or more embodiments disclosed are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of one or more embodiments of the invention.

One or more embodiments disclosed within this specification relate to semiconductor integrated circuits (ICs) and, more particularly, to cell-level electrostatic discharge (ESD) protection for use within an IC. In accordance with the inventive arrangements disclosed within this specification, an ESD protection requirement can be determined for a layout cell. The layout cell can be compared with a variety of different ESD requirements established for the IC within which the layout cell is to be included. For example, a determination can be made as to whether an outer perimeter of the layout cell is surrounded by sufficient substrate taps, vias, and regions of interconnect material. Further, the layout cell can be evaluated to determine whether the vias and interconnect material layers within the layout cell facilitate direct coupling of the substrate taps surrounding the outer perimeter of the layout cell to a ground bus residing in the IC within which the layout cell is to be implemented.

The layout cell can be evaluated to identify one or more regions of unused substrate and one or more substrate taps within the outer perimeter of the layout cell. The regions can be analyzed to ensure that each one of the unused substrate regions does not exceed a size threshold specified by the ESD requirements. Substrate tap spacing can be checked against a spacing threshold specified by the ESD requirements. An indication can be generated and output indicating whether the layout cell meets the ESD requirements and, if not, which ESD requirements are not met. When the layout cell meets or exceeds the ESD requirements, the resulting ESD protected layout cell can be instantiated at any level of an IC layout hierarchy and withstand an ESD event of a level required by the ESD requirements.

Figure 1:
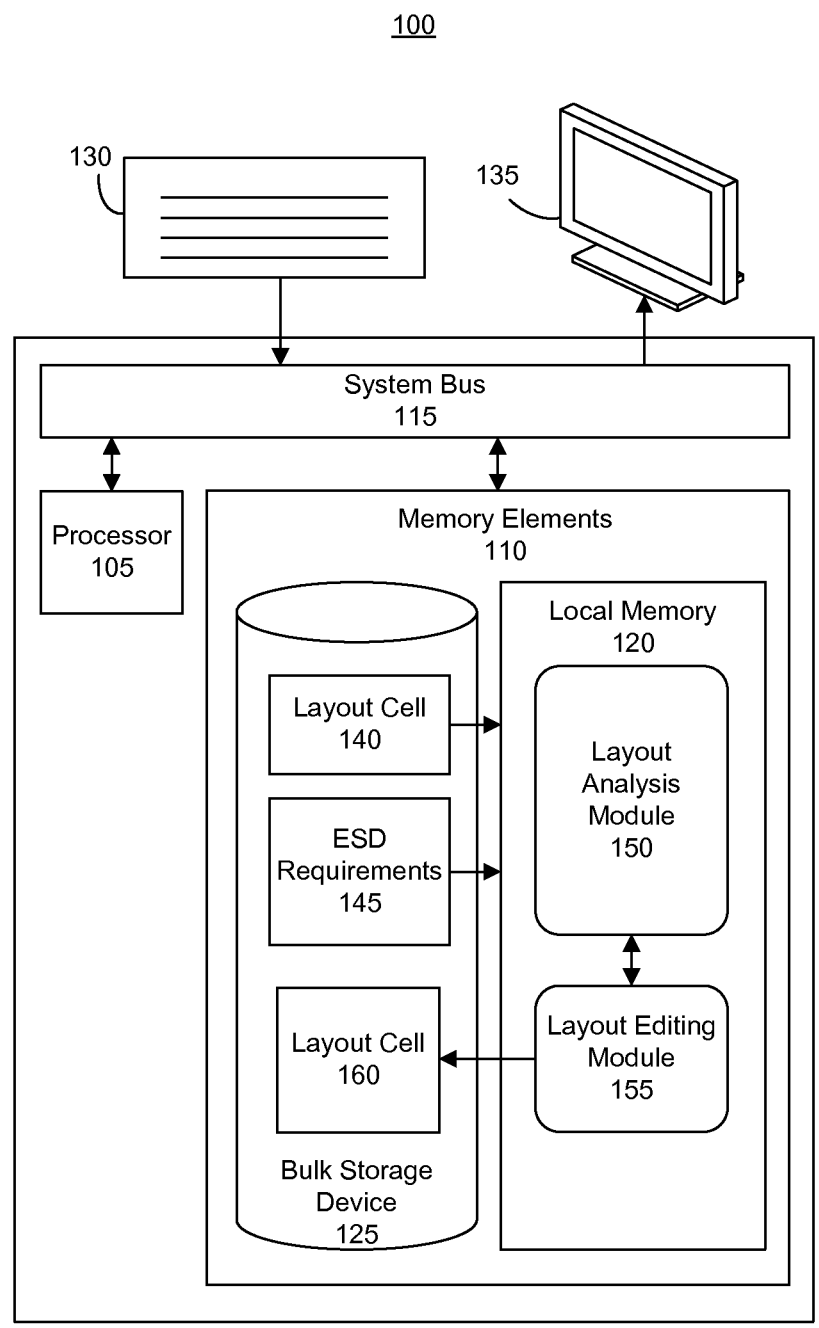
FIG. 1 is a block diagram illustrating a system for cell-level electrostatic discharge (ESD) evaluation and protection for use in designing an integrated circuit in accordance with one embodiment of the present invention.

FIG. 1 is a block diagram illustrating a system for cell-level ESD evaluation and protection for use in designing an IC in accordance with one embodiment of the present invention. In one aspect, system 100 can generate an ESD protected layout cell for instantiation within the IC.

As pictured in FIG. 1, system 100 can include at least one processor 105 coupled to memory elements 110 through a system bus 115. As such, system 100 can store program code within memory elements 110. Processor 105 can execute the program code accessed from memory elements 110 via system bus 115. In one aspect, for example, system 100 can be implemented as a computer that is suitable for storing and/or executing program code. It should be appreciated, however, that system 100 can be implemented in the form of any system comprising a processor and memory that is capable of performing the functions described within this specification.

Memory elements 110 can include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard drive or other persistent data storage device. System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other systems, computer systems, remote printers, and/or remote storage devices through intervening private or public networks. Modems, cable modems, and Ethernet cards are examples of different types of network adapters that can be used with system 100.

Memory elements 110 can store layout analysis module 150 and layout editing module 155. Layout analysis module 150 and layout editing module 155, being implemented in the form of executable program code, can be executed by system 100. Layout analysis module 150 can receive a layout cell 140 and one or more ESD requirements (hereafter "ESD requirements") 145. Layout cell 140 can programmatically describe the various process layers of an IC manufacturing process used to implement a circuit block within an IC. For example, layout cell 140 can include various parameters that specify physical dimensions of each of the one or more process layers used to form the circuit block.

As used within this specification, a "layout" or "IC layout," can refer to a representation of an IC in terms of planar geometric shapes that correspond to the design masks that pattern the metal layers, the oxide regions, the diffusion areas, and/or other process layers that make up devices of the IC. A "cell" or "layout cell" can refer to a segment or section of an IC layout that can be considered a discrete unit and, as such, represents a distinct layout region to be designed and verified using the physical design and verification computer aided design (CAD) tools of an IC manufacturing process, e.g., system 100. A cell or layout cell typically defines or specifies a circuit block having a defined or particular function.

Layout analysis module 150 can determine whether various features of layout cell 140 meet ESD requirements 145. For example, layout analysis module 150 can determine an outer perimeter of layout cell 140. Layout analysis module 150 can determine whether a substrate ring surrounds the outer perimeter of layout cell 140 and whether the substrate ring complies with ESD requirements 145. Layout analysis module 150 further can output an indication of whether the substrate ring exists and meets ESD requirements 145.

In another example, layout analysis module 150 can identify unused regions of substrate that reside within layout cell 140 and calculate the size of the unused substrate regions. Layout analysis module 150 can determine whether the size of the unused substrate regions exceeds a size threshold specified by ESD requirements 145. Layout analysis module 150 can output an indication of whether one or more identified and unused substrate regions within layout cell 140 exceed the size threshold.

In yet another example, layout analysis module 150 can identify each substrate tap within the outer perimeter of layout cell 140. Layout analysis module 150 can determine spacing between different ones, e.g., pairs, of substrate taps. Layout analysis module 150 can determine whether the spacing between substrate taps exceeds a spacing threshold specified by ESD requirements 145 and output an indication of whether the spacing between identified substrate taps exceeds the spacing threshold.

Layout editing module 155 can receive layout cell 140 and ESD requirements 145. Through layout editing module 155, a user or a system, e.g., system 100, can alter one or more features of layout cell 140 that are indicated by layout analysis module 150 to be deficient in meeting ESD requirements 145. For example, layout editing module 155 can add substrate taps, add one or more vias, add one or more regions of interconnect material, alter the size of unused substrate regions, alter the spacing between substrate taps, or the like to layout cell 140. Layout editing module 155 can output an altered version of layout cell 140 as layout cell 160. As used herein, "outputting" and/or "output" can mean storing in memory elements 110, for example, writing to a file stored in memory elements 110, writing to display 135 or other peripheral output device, sending or transmitting to another system, exporting, or the like.

In operation, layout analysis module 150 can receive layout cell 140 and ESD requirements 145. ESD requirements 145 can specify various layout design and verification parameters that, when applied to layout cell 140, assure that an IC in which layout cell 140 is implemented can withstand an ESD event of a predetermined intensity. Layout analysis module 150 can identify the various geometric shapes, associated with IC manufacturing process layers within layout cell 140. Analyzing the various geometric shapes and/or structures, layout analysis module 150 can determine an outer perimeter of layout cell 140. As each IC manufacturing process can contain differing process layers, the manner in which layout analysis module 150 determines the perimeter of layout cell 140 can vary according to the IC manufacturing process being used to implement the IC within which layout cell 140 is to be implemented. In addition, feature size and spacing requirements of the IC manufacturing process can influence the determination of the outer perimeter of layout cell 140 by layout analysis module 150.

Having determined the outer perimeter of layout cell 140, layout analysis module 150 can determine whether a substrate ring surrounds the outer perimeter of layout cell 140. Additionally, layout analysis module 150 can determine whether the substrate ring is sufficiently robust to provide a level of ESD protection as required by ESD requirements 145. For example, layout analysis module 150 can determine whether a number of substrate taps and a size of each substrate tap encompassing the outer perimeter of layout cell 140 conforms with ESD requirements 145. The ring of substrate taps, for example, can be adjacent to, and surround, the outer perimeter of layout cell 140. In addition, layout analysis module 150 can identify regions of one or more interconnect material layers within the substrate ring that couple the substrate taps of layout cell 140 to a ground bus within the IC in which layout 140 is to be implemented. Accordingly, layout analysis module 150 can determine whether a number of the regions and a size of each region of the interconnect material layer(s) are sufficiently robust to provide the level of ESD protection as required by ESD requirements 145, e.g., conform with ESD requirements 145. Typically, the ground bus is accessible at the top level of a layout hierarchy for the IC.

For example, to determine whether the substrate ring is sufficiently robust, layout analysis module 150 can determine whether a number and a size of at least one via used within the substrate ring to couple adjacent interconnect material layers is sufficiently robust to withstand the voltage potentials and currents generated during the occurrence of an ESD event of a predetermined intensity. When layout analysis module 150 determines that any feature of the substrate ring is deficient in providing the level of ESD protection required by ESD requirements 145, layout analysis module 150 can output an indication identifying the feature that is deficient.

Subsequent to identifying the feature, layout analysis module 150 can provide layout cell 140 to layout editing module 155. Through layout editing module 155, layout cell 140 can be altered to overcome the deficient features of the substrate ring identified by layout analysis module 150. In one or more embodiments, layout editing module 155 can include a user interface though which a user can perform edits altering layout cell 140. The user edits can alter features of layout cell 140 in a manner that overcomes each deficiency identified by layout analysis module 150.

In one or more other embodiments, layout editing module 155 can receive layout cell 140, ESD requirement data 145, the indication(s) of deficient features from layout analysis module 150, and automatically alter layout cell 140 in a manner that overcomes the identified and deficient features. For example, layout analysis module 150 can determine if layout cell 140 lacks a substrate ring. Using the outer perimeter determined by layout analysis module 150 for layout cell 140, layout editing module 155 can automatically add a substrate ring adjacent to, and surrounding, the outer perimeter of layout cell 140. The dimensions and characteristics of the substrate ring created by layout editing module 155 can be determined from ESD requirements 145. Subsequent to editing layout cell 140, layout editing module 150 can return layout cell 140 to layout analysis module 150 for further analysis.

Continuing, layout analysis module 150 can identify each region of unused substrate within the outer perimeter of layout cell 140. As described, variations in IC manufacturing processes such as process layer types, feature sizes, feature spacing, and the like, can affect the characteristics, size, and shape of regions identified by layout analysis module 150 as unused substrate. In one or more embodiments, layout analysis module 150 can determine that any region, within the outer perimeter of layout cell 140, containing no regions of n-diffusion layer and no substrate taps is an unused substrate region.

For each unused substrate region identified, layout analysis module 150 can determine whether the size of the unused substrate region exceeds a size threshold specified by ESD requirements 145. Using the size threshold, layout analysis module 150 can assure that no unused substrate region exists within layout cell 140 that exceeds the size threshold. The value of the size threshold specified by ESD requirements 145 can vary depending upon the level of ESD protection desired for the IC within which layout cell 140 is to be implemented.

When layout analysis module 150 determines that the size of one or more unused substrate regions exceeds the size threshold, layout analysis module 150 can output an indication that the one or more unused substrate regions exceeds the size threshold. Subsequent to generating the indication, layout analysis module 150 can pass layout cell 140 to layout editing module 155. Layout editing module 155, either under manual control or automatically, can alter layout cell 140 to reduce the size of each identified and unused substrate region that exceeds the size threshold.

Continuing, layout analysis module 150 can identify each substrate tap within the outer perimeter of layout cell 140. Layout analysis module 150 can determine the space or distance between pairs of substrate taps. Layout analysis module 150 can determine whether the space between the substrate taps exceeds the spacing threshold specified by the ESD requirements 145. Using the spacing threshold, layout analysis module 150 can assure that no unused substrate region exists within layout cell 140 that is not coupled, via a substrate tap, to a ground potential. The value of the spacing threshold specified within ESD requirements 145 can vary depending upon the level of ESD protection desired for the IC within which layout cell 140 is to be implemented.

When layout analysis module 150 determines that the space between one or more pairs of substrate taps exceeds the spacing threshold, layout analysis module 150 can output an indication that the maximum space between the substrate taps exceeds the spacing threshold. Subsequent to generating the indication, layout analysis module 150 can provide layout cell 140 to layout editing module 155. Through layout editing module 155, layout cell 140 can be altered in a manner that reduces the spacing between pairs of substrate taps to be less than or equal to the spacing threshold. For example, additional substrate taps can be added or existing substrate taps can be relocated.

Subsequent to layout cell 140 being altered to correct each deficiency identified by layout analysis module 150, the altered version of layout cell 140 can be stored within bulk memory device 125 as layout cell 160. Layout cell 160 can represent a layout cell design sufficiently robust to withstand an ESD event of a predetermined intensity associated with ESD requirements 145.

Figure 2:
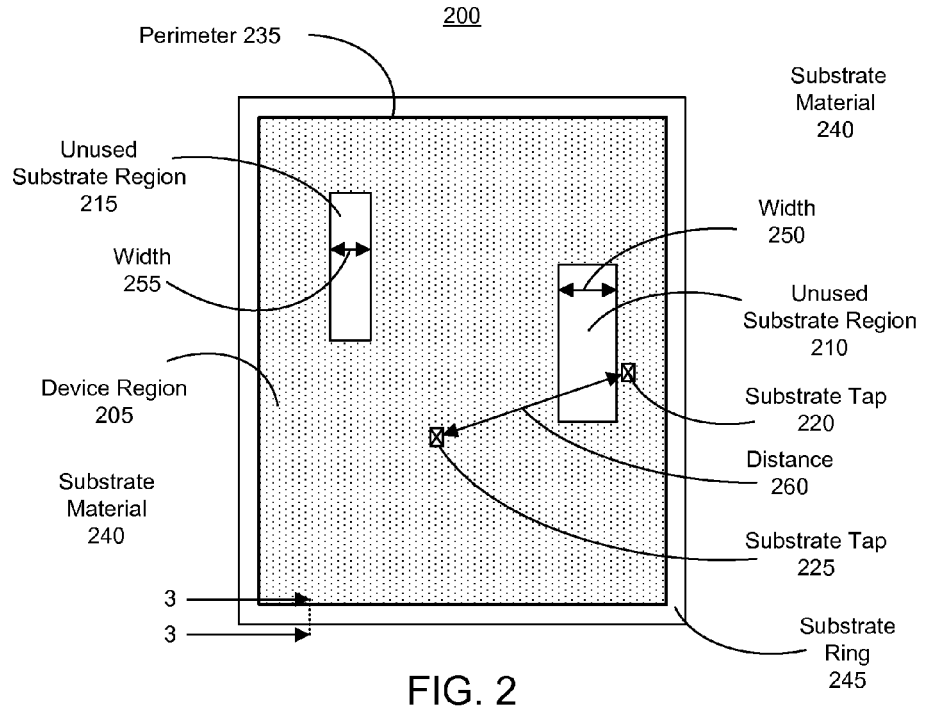
FIG. 2 is a topographic surface view of a layout cell in accordance with another embodiment of the present invention.

FIG. 2 is a topographic surface view of a layout cell 200 in accordance with another embodiment of the present invention. Layout cell 200 illustrates a layout cell to be implemented within a layout hierarchy of an IC. Layout cell 200 illustrates a layout cell to be submitted to a system, such as system 100 described with reference to FIG. 1, for evaluation of ESD protection. Layout cell 200 can include device region 205, unused substrate regions 210 and 215, and substrate taps 220 and 225.

Device region 205 can include regions of layout cell 200 that do not constitute unused substrate material. Depending upon the IC manufacturing process used to manufacture layout cell 200, device region 205 can include active devices, devices implemented with, or within, diffusion regions, diffusion or substrate regions coupled to known voltage potentials, dielectric isolation regions, or any other regions of layout cell 200 that do not constitute unused substrate. A variety of approaches can be used to differentiate device region 205 from unused substrate material.

In one or more embodiments, the system can determine device region 205 by merging geometric shapes within layout cell 200 associated with regions of process layers used to implement devices defined as used substrate. For example, all n-diffusion layer regions, i.e., regions of a process layer associated with building an active device, and substrate taps within layout cell 200 can be identified. The geometric shapes associated with the n-diffusion regions and the substrate taps can be merged into, or considered, a single geometric shape. The system can define the single geometric shape as device region 205.

Within layout cell 200, the area surrounding device region 205 is assumed to be unused substrate and is designated as substrate material 240. With device region 205 defined, the system can determine an outer perimeter of device region 205. In one or more embodiments, the system can define the interface between device region 205 and substrate material 240, i.e., perimeter 235, as the outer perimeter of device region 205. With perimeter 235 determined, substrate ring 245 can be disposed adjacent to, and surrounding, perimeter 235 to provide ESD protection to layout cell 200. Substrate ring 245 can include substrate taps, vias, and regions of interconnect material layers required to couple the substrate material 240 adjacent to perimeter 235 to a ground bus in the IC.

As layout cell 200 can be created without prior knowledge of the larger layout hierarchy within which layout cell 200 is to reside, and/or other layout cell(s) that can reside adjacent to layout cell 200 in the layout hierarchy, the system assumes the area surrounding device region 205 is unused substrate material. Disposing substrate ring 245 around device region 205 can assure that device region 205 is protected from ESD event damage caused by adjacent unused substrate material regions no matter where layout cell 200 resides within the layout hierarchy. For example, an IC that is ESD tested by exposing the IC to a charge device model (CDM) type of ESD event demonstrates a tendency to suffer active device, e.g., N-type field effect transistor (NFET), failures within active devices neighboring large regions of unused substrate represented by substrate material 240 in FIG. 2. When coupled to a ground bus within the IC, substrate ring 245 can isolate device region 205 from areas of substrate material 240 that reside adjacent to perimeter 235, thereby protecting device region 205 from a CDM type of ESD event.

Although substrate ring 245 can isolate device region 205 from substrate material 240, unused substrate regions may be present within device region 205. Unused substrate regions 210 and 215 represent two distinct finite regions of unused substrate material enclosed within device region 205. The system can identify each of unused substrate regions 210 and 215 as unused substrate material. The system can compare a size of each of unused substrate regions 210 and 215 to a size threshold. For example, the system can determine that width 255 of unused substrate region 210 exceeds the size threshold of the ESD requirements. Accordingly, layout cell 200 requires modification, e.g., a reduction in the size of unused substrate region 210, to achieve a desired level of ESD protection. Alternatively, the system can determine that width 255 of unused substrate region 215 is below the size threshold and that layout cell 200 requires no modification.

The size threshold can vary according to the ESD protection requirements for the IC in which layout cell 200 is implemented. In addition, the parameters that define size can vary according to the IC manufacturing process used to implement layout cell 200 and the ESD protection requirements for the IC. The size threshold can be measured in terms of a length, a width, and/or an area of an unused substrate region depending upon the ESD protection requirements for the IC and the IC manufacturing process with which the IC is to be implemented.

For example, since active devices can suffer failures when neighboring regions of unused substrate, active devices within device region 205 that neighbor unused substrate regions 210 and 215 can be damaged by a CDM type of ESD event of sufficient intensity. As the intensity of the CDM type of ESD event increases, the size of the region of unused substrate neighboring an active device required to damage the active device decreases. For this reason, as the level of ESD protection required for layout cell 200 increases, the value assigned to the size threshold decreases. Decreasing the size threshold decreases the maximum size of an unused substrate region allowed within device region 205. As the maximum size of an unused substrate region allowed within device region 205 decreases, the immunity of layout cell 200 to a CDM type of ESD event increases.

When either of unused substrate regions 210 and/or 215 exceeds the size threshold, layout cell 200 can be altered in a manner that reduces the size of each of unused substrate regions 210 and 215 so as not to exceed the size threshold. For example, one or more substrate taps can be disposed within unused substrate region 210 in order to reduce the amount of unused substrate contained within unused substrate region 210.

The system further can identify one or more substrate taps within perimeter 235. For example, the system can identify each of substrate taps 220 and 225. The system can calculate a maximum spacing between substrate taps within device region 205. For example, distance 260 can represent the spacing between substrate taps 220 and 225 within device region 205. The system can compare distance 260 to the spacing threshold specified by the ESD requirements. For example, the system can determine that distance 260 exceeds the spacing threshold and that layout cell 200 requires additional substrate taps to achieve the desired level of ESD protection. In that case, the system can dispose one or more additional substrate taps within perimeter 235 to reduce the space between substrate taps within device region 205 below the spacing threshold. It should be appreciated that while only two substrate taps are illustrated within device region 205, more than two can be included. For example, a grid of substrate taps can be included. Accordingly, the system can check the distance to the right, left, up, and down, from each substrate tap to the next adjacent substrate tap or the perimeter 235 in each respective direction. No substrate tap, for instance, should be separated from the next adjacent tap or perimeter 235 in any direction by more than a predetermined distance specified by the ESD requirements.

Figure 3:
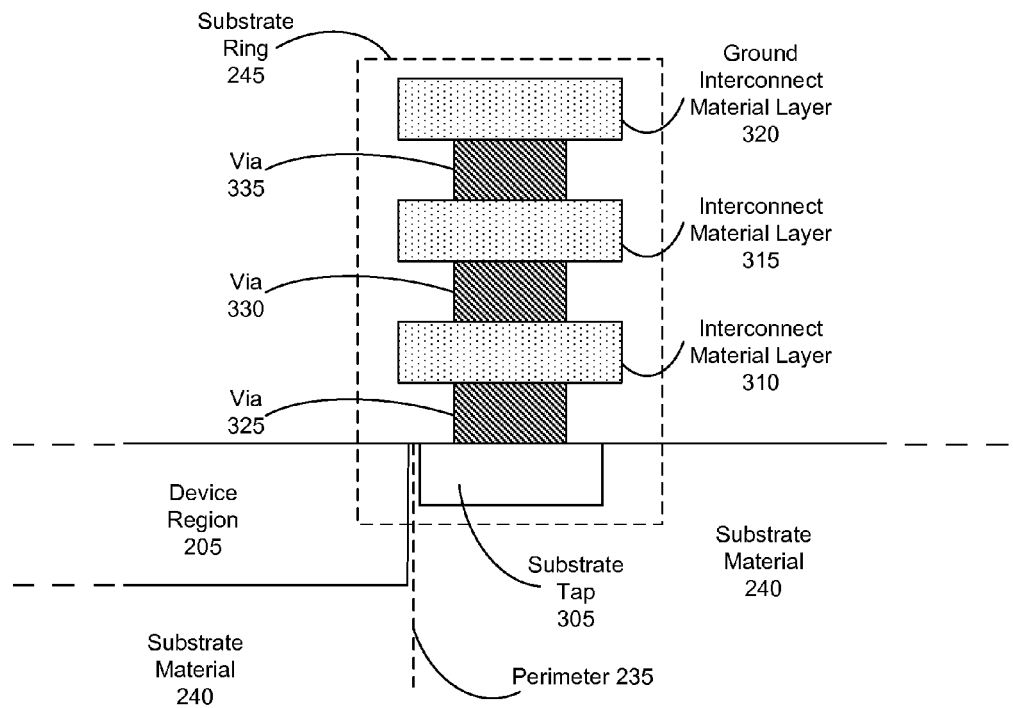
FIG. 3 is a cross-sectional side view of a portion of a layout cell in accordance with another embodiment of the present invention.

FIG. 3 is a cross-sectional side view of a portion of layout cell 200 in accordance with another embodiment of the present invention. FIG. 3 illustrates a cross-section of substrate ring 245 described with reference to FIG. 2 taken along cut-line 3. As such, like numbers will be used to refer to the same items throughout this specification. Substrate ring 245 can couple the substrate material adjacent to, and surrounding, layout cell 200 (not shown) to a ground bus in an IC within which layout cell 200 is to be implemented. Substrate ring 245 can include substrate tap 305, interconnect material layers 310, 315 and 320, and vias 325, 330, and 335.

Substrate tap 305 can be formed of a single tap or a plurality of taps disposed along an outer edge of perimeter 235. For example, substrate tap 305 can be formed as a single, ring or rectangular shaped tap encompassing the device region. Alternatively, substrate tap 305 can be formed of a plurality of taps in ring or rectangular shape encompassing the device region, where each tap is separated from each other tap forming substrate tap 305 by a predetermined distance that can be checked against the ESD requirements.

As used within this specification, "a tap" can refer to a physical IC structure that electrically couples an IC layer to a metal layer through which the IC layer can be coupled to other structures within the IC. Taps can include one or more IC process layers. Accordingly, substrate tap 305 can couple substrate material 240 to another conductive material, e.g., interconnect layer 310 through via 325, or a predetermined voltage potential.

The density of substrate taps used to implement substrate tap 305 can be determined by the level of ESD protection required. As the intensity of an ESD event increases, the greater the density of substrate taps required to divert ESD event generated currents away from device region 205. For example, larger densities can be achieved through smaller spacing between taps forming substrate tap 305. Providing a path to ground for currents generated by the ESD events assures that the voltage potential of substrate material 240 surrounding device region 205 remains approximately equal to ground. Although substrate taps are typically coupled to a ground potential within an IC, on occasion substrate taps can be coupled to alternative voltage potential available within the IC. As such, the coupling of substrate tap 305 to ground, as illustrated within this specification, is for descriptive purposes only and is not intended to limit the one or more embodiments disclosed herein.

Each of vias 325-335 couples substrate tap 305 or one of interconnect material layers 310-320 to an adjacent interconnect material layer of interconnect material layers 310-320. Vias 325-335 represent one or more via structures typically used within an IC manufacturing process to electrically couple different, i.e., vertically distinct, interconnect material layers within the IC. As the different interconnect material layer can be vertically isolated by an insulating layer such as, for example, field oxide, vias 325-335 can create a vertical conductive pathway through the insulating layer. Each of vias 325-335 can electrically couple any two of substrate tap 305, interconnect material layers 310, 315, and 320 that reside on adjacent process layers. Vias 325-335 each can be a single via or a plurality of vias, coupling two adjacent process layers.

Although illustrated as being vertically stacked and vertically aligned within FIG. 3, vias 325-335 can be vertically offset. The vertical stacking and alignment of vias 325-335 as illustrated within FIG. 3 is for purposes of description only and is not intended to limit the one or more embodiments described within this specification. In some cases, for example, IC manufacturing processes preclude the vertical stacking and/or alignment of vias in order to enhance manufacturing yields and improve IC reliability. In combination, substrate tap 305, interconnect material layers 310-320, and vias 325-335 create a continuous conductive pathway from substrate material 240 to the ground bus.

Referring to FIG. 3, ground interconnect material layer 320 can be coupled to the ground bus. Typically within an IC, the ground bus is routed or formed with a top-level interconnect material layer of the IC, i.e., the interconnect material layer farthest from substrate material 240. The top interconnect material layer is typically the thickest interconnect material layer having the lowest sheet resistance value. As such, when seeking to reduce ground bus resistance, the top interconnect material layer can be superior to other interconnect material layers for routing the ground bus. Within FIG. 3, ground interconnect material layer 320 represents the top-level interconnect material layer and/or the interconnect material layer within which the ground bus of the IC is implemented.

Substrate ring 245 can be implemented to couple together each interconnect material layer residing between substrate tap 305 and interconnect material layer 320. Although implemented with three interconnect material layers within FIG. 3, substrate ring 245 can be implemented with different numbers of interconnect material layers. The number of interconnect material layers used to implement substrate ring 245 depends upon the number of interconnect material layers within an IC manufacturing process residing between the IC substrate and the interconnect material layer within which the ground bus of the IC is implemented. For example, some modern IC manufacturing processes can be implemented with ten or more distinct interconnect material layers. In that case, ten or more interconnect material layers can be coupled together with vias to implement substrate ring 245.

The density of vias to be disposed within substrate ring 245 can be determined by the level of ESD protection required. Additionally, the size, e.g., width, and number of interconnect material layers to be disposed within substrate ring 245 can be determined by the level of ESD protection required.

Typically, during a mask design process for an IC, layout cells are coupled together within a hierarchical layout architecture. At the top level of the layout hierarchy, IC wide signals, e.g., clock signals and power supply buses, are routed across the IC and coupled to layout cells comprising the top level of the layout hierarchy. Each top-level layout cell can include two or more mid-level layout cells coupled together with regions of interconnect material. Each mid-level layout cell can include two or more lower-level layout cells, etc., until a bottom level of the layout hierarchy is reached. During the mask design process, the location of a layout cell within the hierarchical architecture may not be determined. For this reason, the type of interconnect material that overlays the layout cell may not be known at the time the layout cell is created prior to coupling the layout cell to the ground bus at the top level of the layout hierarchy.

For example, layout cell 200 can be in a lower level of an IC layout hierarchy. As substrate tap 305 is coupled to substrate material 240, substrate tap 305 resides below the lowest interconnect material layer, e.g. interconnect material layer 310, available within the IC. As such, regions of each of interconnect material layer 310-320 must be coupled together with vias to couple substrate tap 305 to the ground bus. During the mask design process, various regions of interconnect material 310-320 can be routed over layout cell 200 to couple signals shared with, or between, neighboring layout cells. When the routing of the ground bus to substrate tap 305 is withheld until interconnect material layer 320 of the top-level layout hierarchy is routed, the presence of the regions of interconnect material overlying layout cell 200 can obstruct the routing of regions of interconnect material 310-320 and the placement of vias to couple substrate tap 305 to the ground bus.

Even when a conductive pathway can be routed from substrate tap 305 to the ground bus, the robustness of the conductive path created from substrate tap 305 to the ground bus may not be sufficient to handle the level of ESD protection specified for the IC. As such, the density of vias and size of the regions of interconnect material disposed within substrate ring 245 must implement a conductive pathway that is sufficient to meet the level of ESD protection specified for the IC within which substrate ring 245 is implemented.

Figure 4:
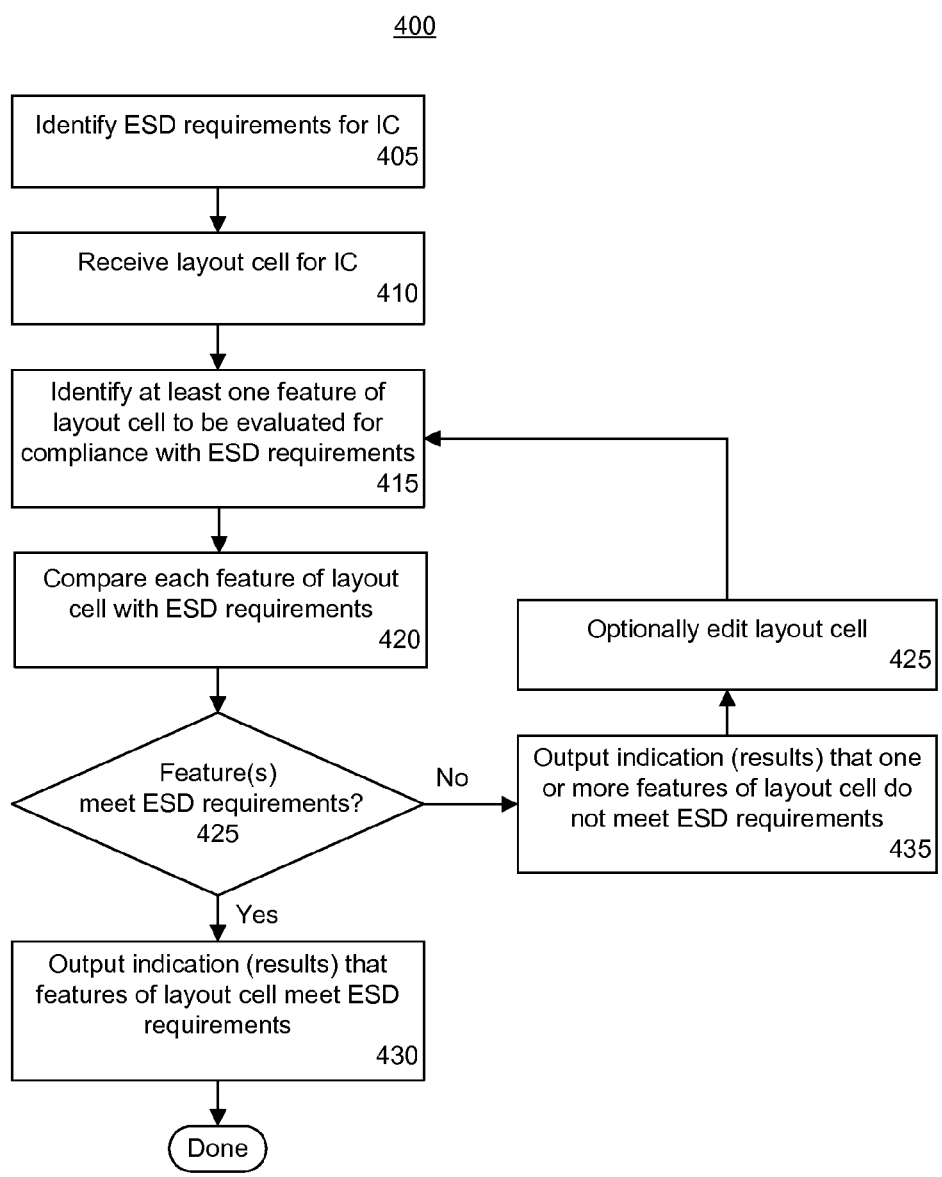
FIG. 4 is a first flowchart illustrating a method of cell-level ESD protection for use within an IC in accordance with another embodiment of the present invention.

FIG. 4 is a first flowchart illustrating a method 400 of providing cell-level ESD protection for an IC in accordance with another embodiment of the present invention. Method 400 describes a technique for analyzing and altering a layout cell in a manner that generates a predetermined level of protection from a CDM type of ESD event for the layout cell when implemented within an IC.

Beginning in step 405, the system can identify ESD requirements for the IC. The ESD requirements for the IC can vary according to the level of protection from a CDM type of ESD event desired for the IC. The ESD requirements can specify, for example, a size threshold for regions of unused substrate material within an outer perimeter of a layout cell, a substrate tap spacing threshold for substrate taps within the outer perimeter of the layout cell, and specifications for a substrate ring surrounding the outer perimeter of the layout cell. Regarding substrate rings, any of the parameters described within this specification can be enumerated within the ESD requirements.

In step 410, the system can receive a layout cell for the IC. In step 415, the system can identify one or more features of the layout cell that are to be evaluated for compliance with the ESD requirements identified in step 405. Each feature, for example, can correspond to, or be, a measurable physical attribute of the layout cell having a corresponding specification in the ESD requirements. In step 420, each feature identified in step 415 can be compared with the ESD requirements to determine whether that feature meets or conforms with the ESD requirements. For example, the system can determine whether layout features such as the substrate ring are capable of providing a level of ESD protection specified by the ESD requirements for the IC.

In decision box 425, the system can determine whether the features meet the ESD requirements based upon the comparison performed in step 420. When the system determines that all features of the layout cell meet the ESD requirements, method 400 can continue to step 430. When the system determines that one or more features of the layout cell do not meet the ESD requirements, method 400 can continue to step 435.

In step 435, the system can output an indication, e.g., the comparison results, that one or more features of layout cell do not meet the ESD requirements for the IC. The indication can specify which features in particular fail to meet the ESD requirements. In step 440, the system optionally can edit the layout cell to correct or otherwise modify one or more of the features of the layout cell that do not comply with the ESD requirements. In one or more embodiments, editing of the layout cell can be manually performed by a user. In or more other embodiments, the system, or an alternative system, can modify the layout cell automatically in a manner that satisfies the ESD requirements for the IC for at least one non-compliant feature. Subsequent to editing the layout cell, method 400 can loop back to step 415 to continue evaluating features of the layout cell to determine compliance with the ESD requirements.

Continuing with step 430, the system can output an indication that all features of the layout cell meet the ESD requirements. Having determined that the layout cell meets the ESD requirements, the resulting layout cell can be output. The resulting layout cell can be implemented at any level of a layout hierarchy while providing the level of ESD protection specified by the ESD requirements.

Figure 5:
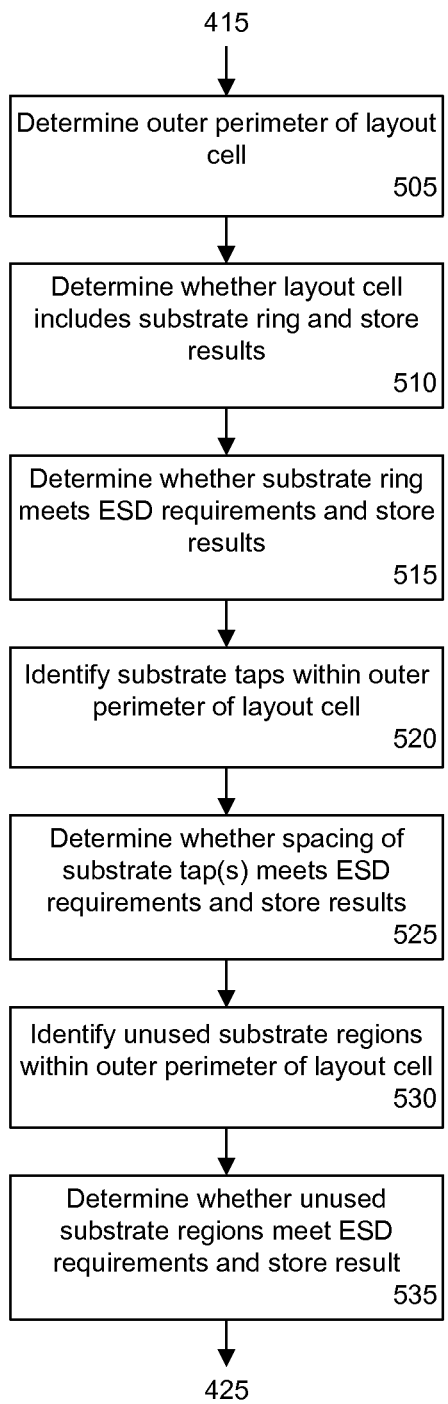
FIG. 5 is a second flowchart illustrating a method of determining whether features of a layout cell meet ESD requirements in accordance with another embodiment of the present invention.

FIG. 5 is a second flowchart illustrating a method 500 of determining whether features of a layout cell meet ESD requirements in accordance with another embodiment of the present invention. More particularly, method 500 of FIG. 5 illustrates a method of comparing features of a layout cell to ESD requirements as described with reference to step 420 of FIG. 4.

Beginning in step 505, the system can determine an outer perimeter of the layout cell. In step 510, the system can determine whether the layout cell includes a substrate ring and store the results. For example, the system can determine whether the outer perimeter of the layout cell is surrounded by a substrate ring as described. In step 515, the system can determine whether the substrate ring conforms to the ESD requirements in terms of, for example, width, substrate tap density, vias, interconnect layers, connectivity to the ground interconnect layer, and the like. The results can be stored for subsequent retrieval or presentation to a user, for example.

In step 520, the system can identify each substrate tap within the outer perimeter of the layout cell. In step 525, the system can determine whether spacing between substrate taps within the outer perimeter of the layout cell exceeds a spacing threshold specified by the ESD requirements and store the results.

In step 530, the system can identify one or more unused substrate regions that reside within the outer perimeter of the layout cell. In step 535, the system can determine whether the unused substrate region(s) meet the ESD requirements and store the results. For example, the system can calculate the size of each unused substrate region and determine whether the size exceeds a size threshold specified within the ESD requirements for unused substrate regions. After step 535, the method can proceed to step 425.

One or more embodiments disclosed within this specification facilitate cell-level ESD protection for use within an IC. By addressing ESD protection at the cell layout level, significant issues relating to the unavailability of interconnect layers or space to implement substrate taps can be avoided. Further, when a layout cell conforms to the established ESD requirements, that layout cell can be used at virtually any location within the design hierarchy for the IC while providing the expected level of ESD protection and/or isolation.

The flowcharts in the figures illustrate the architecture, functionality, and operation of possible implementations of systems and/or methods according to various embodiments of the present invention. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

It should be noted that the different devices used to implement various circuits in accordance with the one or more embodiments described within this specification are for descriptive purposes only and are not meant to be limiting. Circuits implemented with a particular device type disposed within a particular semi-conductor material often can be implemented with a complementary architecture. For example a circuit implemented with an NFET device disposed within a P-type substrate typically can be implemented with a PFET device disposed within an N-type well. Additionally, devices can be disposed within multi-well structures, e.g, a P-type well disposed within an N-type well disposed within a P-type substrate, with differing concentrations of dopant within the semiconductor material of which each well is formed.

One or more embodiments of the present invention can be realized in hardware or a combination of hardware and software. The one or more embodiments can be realized in a centralized fashion in one system or in a distributed fashion where different elements are spread across several interconnected systems. Any kind of data processing system or other apparatus adapted for carrying out the methods described herein is suited.

One or more embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system including memory and a processor, causes the system to perform the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, source code, object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of evaluating a layout cell for electrostatic discharge (ESD) protection, the method comprising:
   identifying at least one feature of the layout cell for use in implementing an integrated circuit (IC);
   comparing, via a processor, the at least one feature of the layout cell to an ESD requirement for the IC; and
   indicating whether the at least one feature of the layout cell complies with the ESD requirement
   wherein the ESD requirement requires the layout cell to include features comprising:
      a device region comprising at least one device; and
      a substrate ring on an outer perimeter of the device region;
         wherein the substrate ring comprises at least one substrate tap, at least one via, and a portion of at least one interconnect material layer encompassing the device region and coupling a substrate material to a ground plane of the IC; and
         wherein the portion of the at least one interconnect material layer of the substrate ring is a conductive layer located above the substrate material and coupled to the at least one substrate tap within the substrate material by the at least one via.

2. The method of claim 1, wherein the at least one feature is a spacing requirement for elements located within a device region of the layout cell and not part of a substrate ring encompassing the device region of the layout cell.

3. The method of claim 2, further comprising:
   determining whether the layout cell comprises at least one substrate ring encompassing the device region of the layout cell;
   responsive to determining that the layout cell does not comprise at least one substrate ring encompassing the device region,
      automatically inserting, via the processor, at least one substrate tap outside, and adjacent to, the device region; and
      automatically inserting at least one of: (a) a via and (b) an interconnect material layer coupling the at least one substrate tap outside of the device region to a ground plane of the IC.

4. The method of claim 1, wherein comparing further comprises:
   identifying unused substrate regions within a device region of the layout cell; and
   determining whether each unused substrate region exceeds a size threshold.

5. The method of claim 4, further comprising:
   responsive to determining that at least one of the unused substrate regions exceeds the size threshold, automatically inserting, via the processor, at least one substrate tap within the device region of the layout cell;
   wherein the at least one substrate tap is not part of a substrate ring encompassing the device region.

6. The method of claim 1, wherein comparing further comprises:
   determining whether, within a device region of the layout cell, spacing between at least two substrate taps not part of a substrate ring encompassing the device region exceeds a spacing threshold.

7. The method of claim 6, further comprising:
   responsive to determining that the spacing between the at least two substrate taps exceeds a spacing threshold, automatically inserting, via the processor, at least one additional substrate tap within the device region of the layout cell;

wherein the at least one additional substrate tap is not part of the substrate ring.

8. A device comprising:
a non-transitory data storage medium usable by a system comprising a processor and a memory, wherein the data storage medium stores program code that, when executed by the system, causes the system to execute operations for evaluating a layout cell for electrostatic discharge (ESD) protection, the operations comprising:
identifying at least one feature of a layout cell for use in implementing an integrated circuit (IC);
comparing the at least one feature of the layout cell to an ESD requirement for the IC; and
indicating whether the at least one feature of the layout cell complies with the ESD requirement;
wherein the ESD requirement requires the layout cell to include features comprising:
  a device region comprising at least one device; and
  a substrate ring on an outer perimeter of the device region;
  wherein the substrate ring comprises at least one substrate tap, at least one via, and a portion of at least one interconnect material layer encompassing the device region and coupling a substrate material to a ground plane of the IC; and
  wherein the portion of the at least one interconnect material layer of the substrate ring is a conductive layer located above the substrate material and coupled to the at least one substrate tap within the substrate material by the at least one via.

9. The device of claim 8, wherein the at least one feature is a spacing requirement for elements located within a device region of the layout cell and not part of a substrate ring encompassing the device region of the layout cell.

10. The device of claim 8, wherein comparing further comprises:
identifying unused substrate regions within a device region of the layout cell; and
determining whether each unused substrate region exceeds a size threshold.

11. The device of claim 10, wherein the data storage medium further stores program code that, when executed by the system, causes the system to execute a further operation comprising:
responsive to determining that at least one of the unused substrate regions exceeds the size threshold, automatically inserting at least one substrate tap within the device region;
wherein the at least one substrate tap is not part of a substrate ring encompassing the device region.

12. The device of claim 8, wherein comparing further comprises:
determining whether, within a device region of the layout cell, spacing between at least two substrate taps not part of a substrate ring encompassing the device region exceeds a spacing threshold.

13. The device of claim 12, wherein the data storage medium further stores program code that, when executed by the system, causes the system to execute a further operation comprising:
responsive to determining that the spacing between the at least two substrate taps exceeds a spacing threshold, automatically inserting at least one additional substrate tap within the device region;
wherein the at least one additional substrate tap is not part of the substrate ring.

14. An integrated circuit (IC), comprising:
a device region comprising at least one device; and
a substrate ring on an outer perimeter of the device region;
wherein the substrate ring comprises at least one substrate tap, at least one via, and a portion of at least one interconnect material layer encompassing the device region and coupling a substrate material to a ground plane of the IC; and
wherein the portion of the at least one interconnect material layer of the substrate ring is a conductive layer located above the substrate material and coupled to the at least one substrate tap within the substrate material by the at least one via.

15. The IC of claim 14, wherein a number of the at least one via used to form the substrate ring depends upon a requirement of the IC, wherein the number specifies a quantity.

16. The IC of claim 14, wherein a number of the at least one substrate tap used to form the substrate ring depends upon a requirement of the IC, wherein the number specifies a quantity.

17. The IC of claim 14, wherein the device region comprises an unused portion of substrate material and a first substrate tap positioned within the unused portion; and
wherein the first substrate tap within the unused portion is not part of the substrate ring.

18. The IC of claim 17, wherein the first substrate tap within the unused portion is positioned according to a size threshold for the unused portion of substrate material that is exceeded.

19. The IC of claim 17, wherein the device region further comprises a second substrate tap positioned relative to the first substrate tap according to a maximum spacing requirement; and
wherein the second substrate tap is not part of the substrate ring.

* * * * *